(12) United States Patent
Burghardt

(10) Patent No.: US 10,133,832 B2
(45) Date of Patent: Nov. 20, 2018

(54) SYSTEM AND METHODOLOGY FOR SUBTERRANEAN PROCESS SIMULATION

(71) Applicant: Schlumberger Technology Corporation, Sugar Land, TX (US)

(72) Inventor: Jeffrey Burghardt, Tooele, UT (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 1143 days.

(21) Appl. No.: 14/452,462

(22) Filed: Aug. 5, 2014

(65) Prior Publication Data

US 2016/0040512 A1    Feb. 11, 2016

(51) Int. Cl.
*G06F 17/50* (2006.01)

(52) U.S. Cl.
CPC ................... *G06F 17/5009* (2013.01)

(58) Field of Classification Search
CPC .................................................. G06F 17/5009
See application file for complete search history.

(56) References Cited

U.S. PATENT DOCUMENTS

| | | | | |
|---|---|---|---|---|
| 2,851,570 A * | 9/1958 | Schaschl | ............. | G01N 17/00 324/700 |
| 3,066,524 A * | 12/1962 | Overhuls | ............. | G01N 15/0806 73/38 |
| 3,992,928 A * | 11/1976 | Thoms | ............. | G01N 3/10 73/784 |
| 4,444,058 A * | 4/1984 | Ratigan | ............. | G01N 3/08 73/834 |
| 4,866,992 A * | 9/1989 | Rice | ............. | G01N 3/08 73/831 |
| 4,928,521 A * | 5/1990 | Jardine | ............. | E21B 12/02 175/39 |
| 5,009,512 A * | 4/1991 | Lessi | ............. | G01B 7/16 33/557 |
| 5,063,785 A * | 11/1991 | Labuz | ............. | G01N 3/10 73/821 |
| 5,193,396 A * | 3/1993 | Gorski | ............. | G01N 3/04 73/831 |
| 5,844,136 A * | 12/1998 | Marsala | ............. | G01N 15/0826 73/38 |
| 6,269,684 B1 * | 8/2001 | Maki, Jr. | ............. | E21B 49/005 73/53.01 |
| 6,560,550 B2 * | 5/2003 | Omar | ............. | G01L 5/0004 702/104 |
| 9,206,681 B2 * | 12/2015 | Zhou | ............. | G01N 33/2823 |

(Continued)

FOREIGN PATENT DOCUMENTS

| | | | |
|---|---|---|---|
| CN | 205091169 U | * 3/2016 | |
| DE | 29616782 U1 | * 12/1996 | ............. G01N 3/02 |

(Continued)

*Primary Examiner* — John Fitzgerald

(57) ABSTRACT

A technique enables simulation of a process performed on an underground formation. The technique comprises forming a cut-out portion in a rock sample and placing a jacket around the rock sample. A sealing collar is inserted into the cut-out portion, and the rock sample is capped between the sealing collar and the jacket. Simulation testing can then be performed on the rock sample through the sealing collar while applying pressure to the rock sample. The sealing collar may be affixed in the cut-out portion.

21 Claims, 4 Drawing Sheets

(56) References Cited

U.S. PATENT DOCUMENTS

| | | | | |
|---|---|---|---|---|
| 9,790,743 B2* | 10/2017 | Li | ............................ | E21B 47/00 |
| 2016/0024370 A1* | 1/2016 | Ba geri | ..................... | C09K 8/03 |
| | | | | 166/305.1 |
| 2016/0103047 A1* | 4/2016 | Liu | ......................... | G01N 3/08 |
| | | | | 73/826 |
| 2016/0103049 A1* | 4/2016 | Liu | ......................... | G01N 3/08 |
| | | | | 73/841 |
| 2017/0218253 A1* | 8/2017 | Ba Geri | ................. | C09K 8/035 |
| 2017/0218733 A1* | 8/2017 | Jain | ..................... | E21B 41/0092 |

FOREIGN PATENT DOCUMENTS

| | | | | |
|---|---|---|---|---|
| DE | 102011118771 B3 * | 4/2013 | ............. | B28D 1/041 |
| SU | 658293 A * | 4/1979 | | |

* cited by examiner

SYSTEM AND METHODOLOGY FOR SUBTERRANEAN PROCESS SIMULATION

BACKGROUND

A variety of techniques are employed in a laboratory environment to simulate the drilling of deep, underground formations. For example, rock (earth) samples may be prepared such that they can be subjected to stresses that simulate those that might be expected in the field environment. These rock samples may be surrounded by impermeable sleeves which are affixed to at least one end cap on at least one distal end of the rock sample. Two end caps may be held together by multiple tie rods positioned outside the impermeable sleeve that covers the rock sample. To simulate a subterranean drilling process, the rock sample is installed in a drilling apparatus that is capable of applying at least some of the horizontal, vertical, pore, drilling fluid, and wellbore stresses that might be encountered in subterranean drilling. A drill bit affixed to the end of a rotating shaft then engages the stressed rock sample and forms a wellbore as a consequence of a compressive load applied axially through the rotating shaft. When simulating the drilling of depleted formations, the pressure of the drilling fluid in the wellbore may be raised to a level exceeding the compressive axial stresses that hold the end cap(s) and the rock sample in contact with each other. When the wellbore pressure is raised to a level that results in a load that exceeds the externally applied load holding the end caps in contact with the rock sample, the end caps may separate from the rock surface, thus allowing the drilling fluid under pressure to flow across the interface and into the space between the external surface of the rock sample and the interior of the impermeable surrounding sleeve. Inflation of the surrounding sleeve can potentially rupture the sleeve. The fluid path between the wellbore and the external periphery of the rock sample detrimentally affects the stress distribution on the rock sample. In order to ensure that the end caps do not separate from the rock sample and a fluid path does not develop, a vertical stress is frequently applied to the sample that is in excess of what is desired for the experiment. The present disclosure describes a means for preventing drilling fluid from traversing the rock sample/end cap interface that is independent of the applied vertical stress.

SUMMARY

In general, the present disclosure provides a methodology and system for simulating subterranean processes, e.g. for simulating drilling in an underground formation. The technique comprises forming a cut-out cavity in a rock sample and placing an impermeable sleeve or jacket around the rock sample. An impermeable collar of a complementary geometry is inserted and adhesively bonded into the cut-out cavity in the rock sample. A structural end cap with an aperture of complementary size and shape to the impermeable collar is positioned on the end of the rock sample with the collar protruding through the aperture. A suitable sealing element is disposed between the walls of the aperture in the end cap and the impermeable collar. The impermeable collar spans the rock sample/end cap interface, thus preventing the flow of fluid along the interface during testing. The impermeable sleeve on the periphery of the rock sample is sealed to the like periphery of the end cap. Drill testing can then be performed on the rock sample while applying pressure and stress to the peripheries of the rock sample.

However, many modifications are possible without materially departing from the teachings of this disclosure. Accordingly, such modifications are intended to be included within the scope of this disclosure as defined in the claims.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate various implementations described herein and are not meant to limit the scope of various technologies described herein, and.

DETAILED DESCRIPTION

Figure 1:
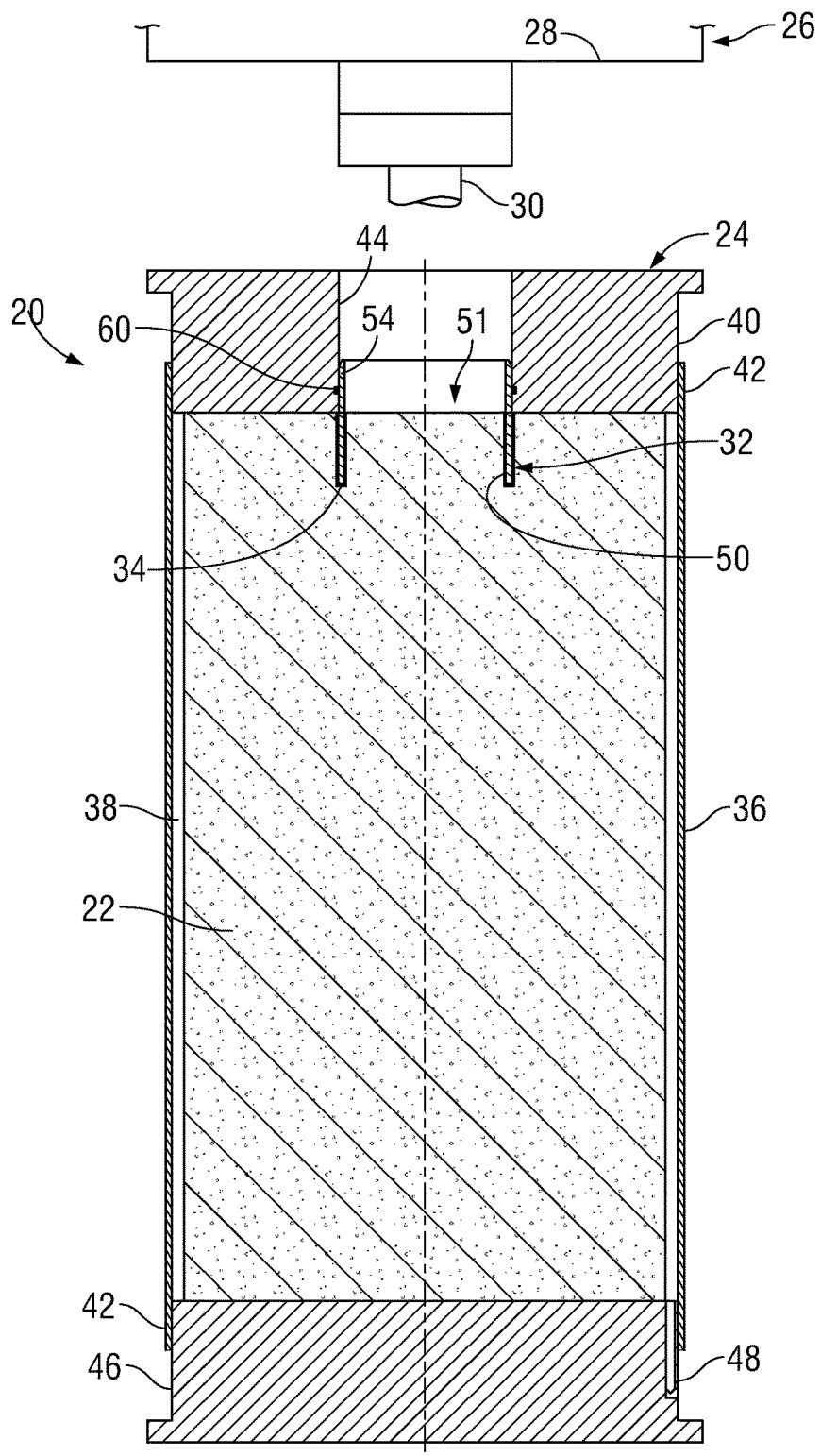
FIG. 1 is a cross-sectional view of an example of a system for simulating underground formation activities, according to an embodiment of the disclosure.

In the following description, numerous details are set forth to provide an understanding of some embodiments of the present disclosure. However, it will be understood by those of ordinary skill in the art that the system and/or methodology may be practiced without these details and that numerous variations or modifications from the described embodiments may be possible.

The present disclosure generally relates to a system and methodology for running simulations on rock samples. For example, the technique enables simulating drilling in an underground formation. A rock sample, e.g. a rock sample from the desired formation, is formed with a cut-out portion extending into the rock. The cut-out portion may be a recess or a closed groove, i.e. a groove forming a continuous path through 360 degrees. An example of a closed groove is an annular or cylindrical groove, although other shapes also can be formed in the rock sample. The technique also comprises placing an impermeable sleeve or jacket around the periphery of the rock sample and inserting and bonding a sealing collar of complementary shape into the cut-out portion. At least one end cap is place on at least one end of the rock sample with at least one protruding sealing collar, such that the at least one sealing collar passes through a complementary aperture in the at least one end cap. At least one suitable sealing component disposed between at least one exterior surface of the sealing collar and at least one interior surface of the aperture prevents the flow of fluid across the rock sample/end cap interfaces. Simulation testing can then be performed on the rock sample by applying pressure and stress to the rock sample and pressurizing a borehole in the rock sample.

In some applications, the simulation involves placing the rock sample in a pressure vessel of a wellbore simulator system. The system comprises a drill which rotates a drill bit into the rock sample through an aperture in the sealing collar. As the drill bit engages and drills a hole in the rock sample, the rock sample may be subjected to isostatic confining pressure and overburden stress applied by a separate actuator. Lateral confining pressures and overburden stresses act to compress the rock sample and to force the end cap or end caps against the ends of the rock sample.

Fluid is pumped through a shaft of the drill bit and exits the bit to cool the cutting structure and to evacuate cuttings generated by the drilling process. The simulated wellbore pressure may be controlled by a series of hydraulic chokes that restrict the exiting drilling fluid. In conventional simulations, wellbore pressure is less than the compressive axial stresses that are being externally applied to the interface between the end cap and rock sample. However, in simulating the drilling of depleted formations, the wellbore pressure is raised to a level that may exceed the compressive axial stresses holding the rock sample stack together. The use of the sealing collar affixed in the cut-out in the rock sample alleviates the potential for a fluid flow path between the end cap and the rock sample. The separation caused by such fluid flow path can cause inflation and rupturing of the jacket surrounding the rock sample and premature termination of the test.

In some applications, the sealing collar may comprise an annular casing or other type of annular collar. However, the sealing collar also may be formed in other shapes. Regardless, the sealing collar spans the rock sample/end cap interface and removes the potential for creating an unwanted flow path between the rock sample and the end cap. The sealing collar may be sealed in the predrilled/preformed cut-out in the rock sample using, for example, an epoxy or other adhesive. The configuration enables the drilling fluid pressure to be sealed with respect to the rock sample and thus the pressure applied to the end cap does not exceed the drilling mud pressure applied to the drill bit. As a result, a greater variety of simulations may be performed, including simulations related to drilling depleted formations in which the simulated wellbore pressure exceeds the pressure applied to the end cap. The sample system configuration, including the use of the sealing collar, expands this type of testing by eliminating the fluid flow path caused by separation of the end cap or end caps from the rock sample.

Referring generally to FIG. 1, a cross-sectional view of an example of a system 20 for simulating underground formation activities is illustrated. In this example, the simulating system 20 employs a rock sample 22 on which simulations, e.g. underground formation simulations, may be performed. The rock sample 22 is enclosed in a containment system 24, e.g. a pressure vessel type containment system, during pressure and drilling simulations performed by a pressure and drilling system 26. The pressure and drilling system 26 may comprise a pressure application system 28 and a drill bit 30 for drilling into rock sample 22. The pressure and drilling system 26 may be similar to those used in existing simulation systems for applying desired pressures and stresses, such as lateral confining pressure and overburden stress. Drill bit 30 may comprise a hollow shaft through which fluid is pumped to cool the cutting structure and to evacuate cuttings generated by the drilling process. Depending on the application, the rock sample 22 may be a formation core or other type of rock sample obtained in a variety of sizes and configurations. In the illustrated example, the rock sample 22 is cylindrical in shape and has generally flat, opposed ends.

Figure 3:
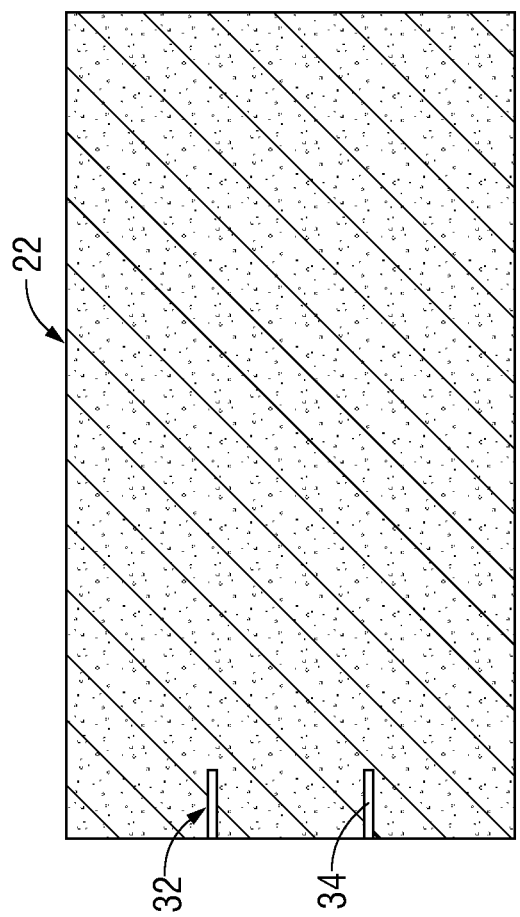
FIG. 3 is a cross-sectional view taken generally along line 3-3 of FIG. 2, according to an embodiment of the disclosure.
Figure 2:
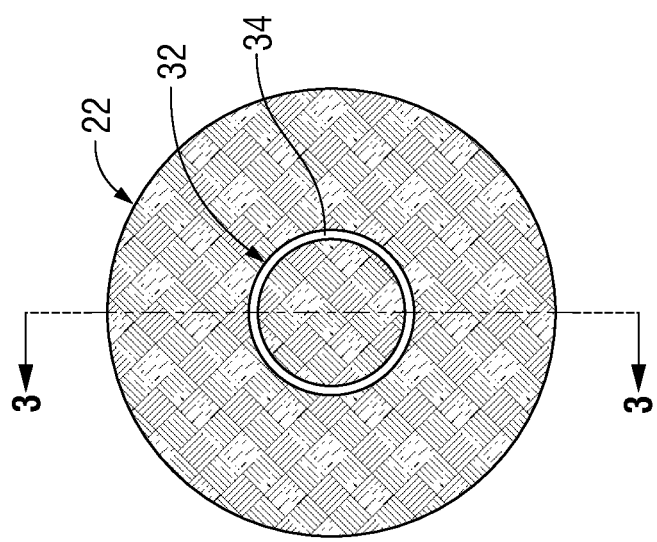
FIG. 2 is a top view of an example of a rock sample used with the simulating system illustrated in FIG. 1, according to an embodiment of the disclosure.

With additional reference to FIGS. 2 and 3, the rock sample 22 comprises a cut-out portion 32 formed in, for example, one of the ends of the rock sample 22. The cut-out portion 32 may be formed as a recess or as another suitable type of cut-out. For example, the cut-out portion 32 may be formed as a closed groove 34, such as the annular groove illustrated in the example shown in FIGS. 2 and 3. However, groove 34 may have various other shapes, depths, and/or configurations.

In the example illustrated, containment system 24 further comprises a sleeve or jacket 36 sized to receive the rock sample 22. The jacket 36 is illustrated as a generally cylindrical jacket, although other shapes may be used to accommodate other configurations of rock sample 22. In some applications, a porous media 38 is disposed between the jacket 36 and the rock sample 22. Additionally, an end cap 40 is secured to the jacket 36 by a suitable securing mechanism 42, e.g. a threaded or clamped connection. The end cap 40 comprises an opening 44 therethrough. As illustrated, the opening 44 may be generally axially oriented to enable drill bit 30 to be moved into engagement with rock sample 22 for drilling into rock sample 22. In this embodiment, a corresponding end cap 46 is secured to the jacket 36 at an opposite end of the rock sample 22 relative to end cap 40. The corresponding end cap 46 may be secured to the jacket 36 via another securing mechanism 42, e.g. a threaded connection or clamp. Additionally, some embodiments may utilize a pressure port 48 located in the corresponding end cap 46.

Figure 5:
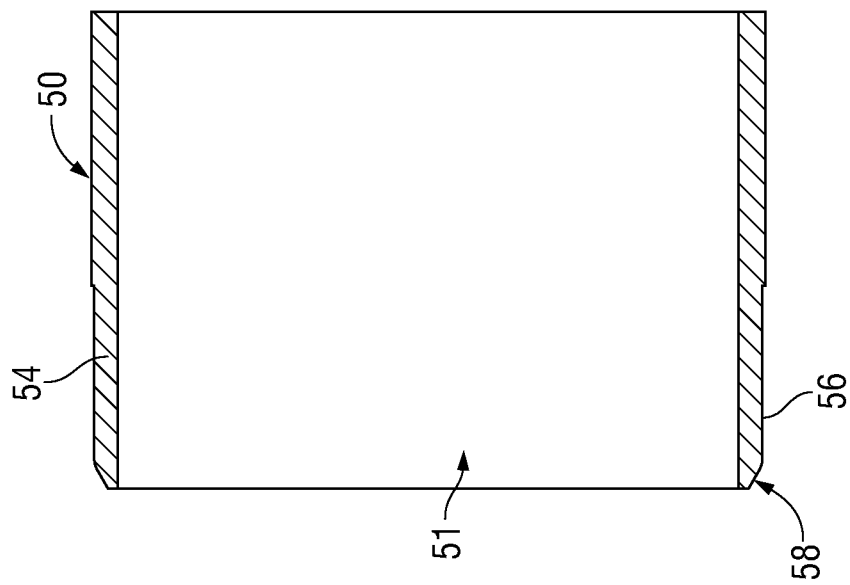
FIG. 5 is a cross-sectional view taken generally along line 5-5 of FIG. 4, according to an embodiment of the disclosure.
Figure 4:
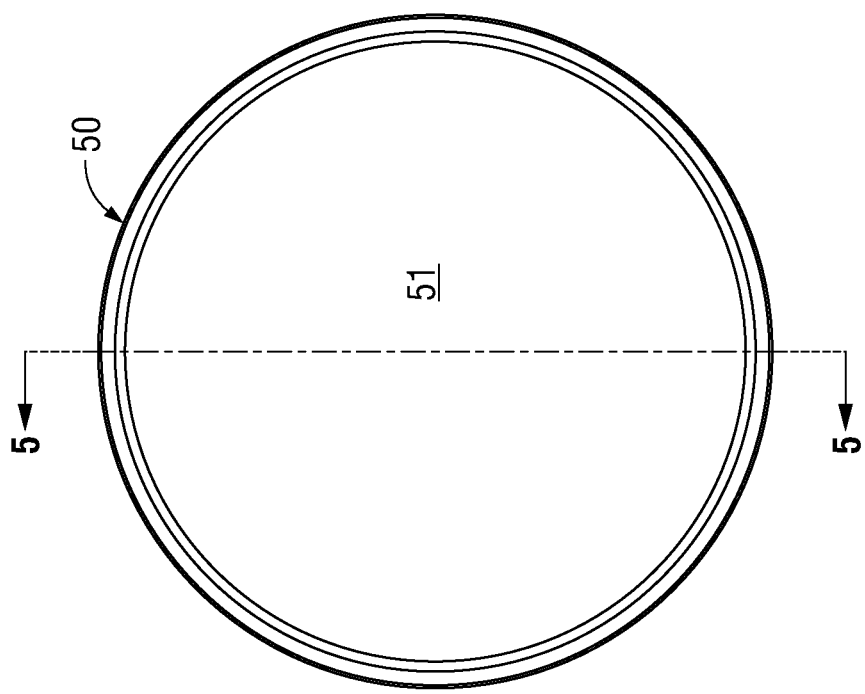
FIG. 4 is a top view of an example of a sealing collar used with the simulating system, according to an embodiment of the disclosure.
Figure 6:
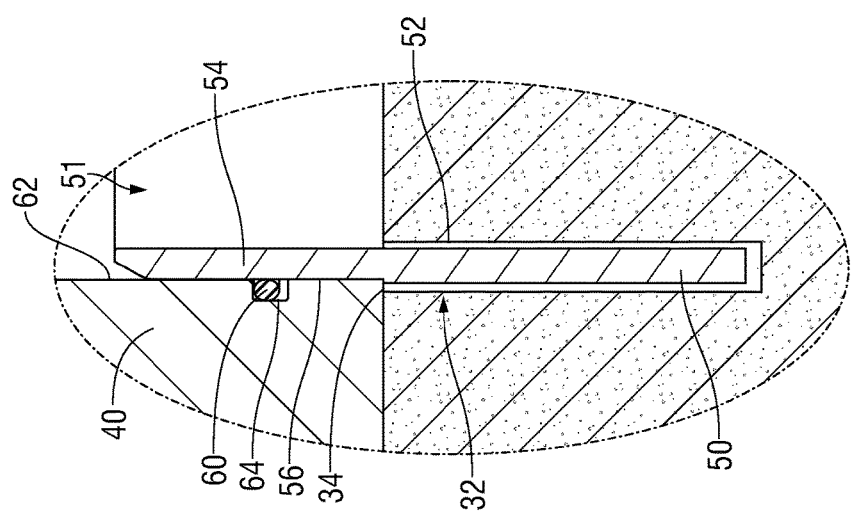
FIG. 6 is an enlarged view of an example of the sealing collar affixed within a cut-out area of the rock sample, according to an embodiment of the disclosure.

With added reference to FIGS. 4 and 5, the simulating system 20 further comprises a sealing collar or sleeve 50 which may be formed as an annular member, e.g. formed from an annular section of tubing. However, the sealing collar or sleeve 50 may be formed with other shapes and configurations selected for receipt in cut-out portion 32. In the illustrated example, sealing collar 50 is an annular or circular sealing collar having an interior 51. In this example, the sealing collar 50 is sized for receipt in the closed groove 34 of rock sample 22, as illustrated in FIG. 6. The sealing collar 50 may be affixed and sealed within the cut-out portion 32 of rock sample 22 by a suitable adhesive 52, e.g. epoxy, or other material which affixes and seals the sealing collar 50 within rock sample 22.

As illustrated, a portion 54 of the sealing collar 50 extends from the rock sample 22 and is received within opening 44 of end cap 40. The portion 54 may have a machined sealing surface 56 and a chamfered edge 58 to facilitate insertion into opening 44. Additionally, a seal 60, such as an O-ring seal or other suitable seal, may be disposed between the sealing surface 56 and a surface 62 forming opening 44. In the example illustrated, seal 60 is disposed within a groove 64 located along surface 62 of end cap 40. The seal 60 and the epoxy/adhesive 52 ensure that pressurized fluid is blocked from moving laterally between the rock sample 22 and end cap 40.

Figure 7:
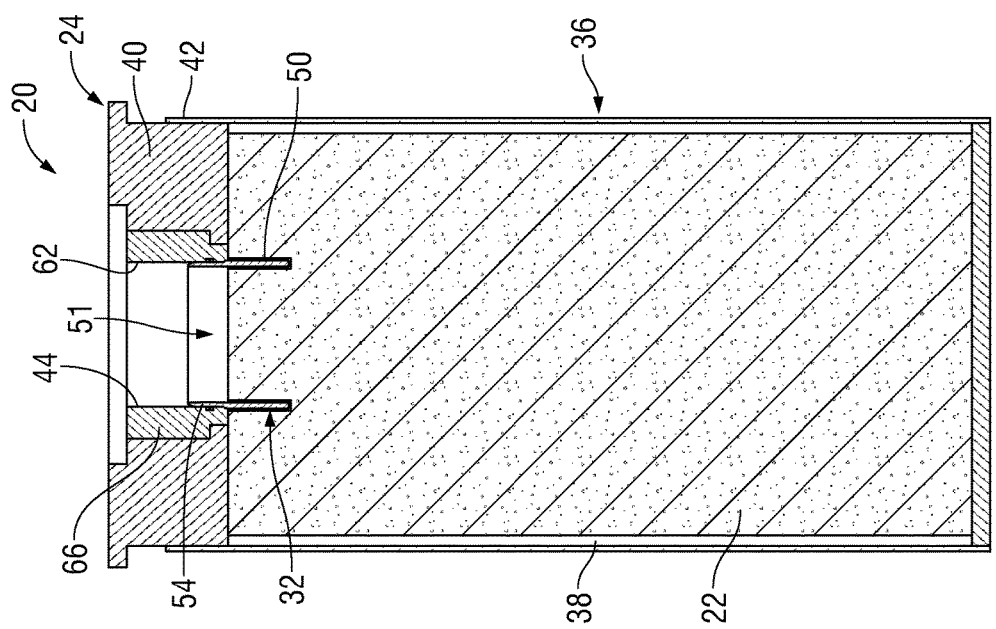
FIG. 7 is a cross-sectional view of another example of a system for simulating underground formation activities, according to an embodiment of the disclosure.

Referring generally to FIG. 7, another embodiment of containment system 24 is illustrated. In this example, the jacket 36 is closed on an end opposite end cap 40. Additionally, the end cap 40 comprises a spacer ring 66 through which opening 44 is formed. The spacer ring 66 provides the interior surface 62 which forms the seal with sealing collar 50. It should be noted, however, that the system 20 may be formed in a variety of other shapes, sizes, and configurations.

For example, the specific arrangement of system components for a given testing procedure may vary. The location of cut-out 32 and sealing collar 50 with respect to rock sample 22 may vary. Similarly, the configuration of the cut-out, the sealing collar, and the sealing collar interior may differ from the illustrated embodiments depending on the parameters of a given simulation application. Additionally, the structure and number of end caps may vary according to the parameters of a given simulation application. The shape and size of the rock sample and the shape and size of the containment system also may vary. The materials used to form the jacket, porous media, sealing collar, end caps, seals, and/or other components of the overall system may be selected to accommodate the specific parameters of the rock sample and of the selected simulation procedure.

Although only a few embodiments of the disclosure have been described in detail above, those of ordinary skill in the art will readily appreciate that many modifications are possible without materially departing from the teachings of this disclosure. Accordingly, such modifications are intended to be included within the scope of this disclosure as defined in the claims.

What is claimed is:

1. A system for simulating drilling in an underground formation, comprising:
    a rock sample disposed in a jacket, the rock sample having a closed groove therein;
    a sealing collar affixed in the closed groove and extending from the rock sample; and
    an end cap secured to the jacket, the end cap having an opening extending therethrough, the opening being positioned to receive the sealing collar, the sealing collar being sealed with respect to the end cap.

2. The system as recited in claim 1, further comprising a layer of porous media disposed between the rock sample and the jacket.

3. The system as recited in claim 1, wherein the sealing collar is sealed with respect to the end cap by an O-ring seal.

4. The system as recited in claim 1, wherein the sealing collar is affixed in the groove via an adhesive.

5. The system as recited in claim 1, wherein the closed groove is an annular groove.

6. The system as recited in claim 5, wherein the sealing collar is circular in cross-section.

7. The system as recited in claim 1, further comprising a corresponding end cap secured to the jacket on an opposite end of the rock sample from the end cap.

8. The system as recited in claim 7, wherein the corresponding end cap comprises a pressure port.

9. The system as recited in claim 1, wherein the end cap is threadably engaged with the jacket.

10. The system as recited in claim 9, further comprising a corresponding end cap threadably engaged with the jacket on an opposite end of the rock sample from the end cap.

11. The system as recited in claim 1, wherein the end cap is clamped to the jacket.

12. The system as recited in claim 11, further comprising a corresponding end cap clamped to the jacket on an opposite end of the rock sample from the end cap.

13. A method for simulating drilling in an underground formation using a rock sample, comprising:
    inserting a sealing collar into the rock sample;
    placing a jacket around the rock sample;
    positioning an end cap between the sealing collar and the jacket;
    sealing the end cap between the sealing collar and the jacket; and
    moving a drill bit through an interior of the sealing collar and drilling into the rock sample.

14. The method as recited in claim 13, wherein placing the jacket around the rock sample comprises placing a tubular jacket around a cylindrically shaped rock sample.

15. The method as recited in claim 13, further comprising securing a corresponding end cap to the jacket on an opposite end of the rock sample with respect to the end cap.

16. The method as recited in claim 13, further comprising subjecting the rock sample to lateral confining pressure and overburden stress during drilling into the rock sample.

17. The method as recited in claim 13, wherein inserting the sealing collar into the rock sample comprises inserting the sealing collar into an annular groove formed in the rock sample.

18. The method as recited in claim 17, further comprising sealing and affixing the sealing collar in the annular groove with an adhesive.

19. A method of performing a simulation on a rock sample, comprising:
    forming a cut-out portion in the rock sample;
    placing a jacket around the rock sample;
    inserting a sealing collar into the cut-out portion;
    capping the rock sample between the sealing collar and the jacket; and
    performing the simulation on the rock sample through the sealing collar while applying pressure to the rock sample.

20. The method as recited in claim 19, wherein performing the simulation on the rock sample comprises drilling the rock sample through an interior of the sealing collar.

21. The method as recited in claim 19, wherein inserting the sealing collar into the cut-out portion comprises affixing the sealing collar in a groove forming the cut-out portion.

* * * * *